United States Patent [19]

Liskov et al.

[11] 4,449,223
[45] May 15, 1984

[54] EYE OPENING MONITOR

[75] Inventors: Nathan A. Liskov, Waltham; Robert G. Curtis; Caesar J. Favaloro, both of Sudbury, all of Mass.; Geogory L. Pence, Allen Park, Mich.

[73] Assignee: Raytheon Company, Lexington, Mass.

[21] Appl. No.: 373,763

[22] Filed: Apr. 30, 1982

Related U.S. Application Data

[63] Continuation of Ser. No. 162,339, Jun. 23, 1980, abandoned.

[51] Int. Cl.³ .......................................... H03K 13/32
[52] U.S. Cl. ...................................... 375/10; 375/52; 375/76; 329/112
[58] Field of Search .................... 375/10, 11, 13, 43, 375/50, 51, 52, 76, 80, 81, 82, 83, 86, 100, 101; 328/115, 147, 162; 307/356, 358, 359, 360; 329/111, 112; 455/214, 60; 340/539, 554; 370/20; 324/121 R, 121 E, 98, 99, 133

[56] References Cited

U.S. PATENT DOCUMENTS

| | | | |
|---|---|---|---|
| 3,214,700 | 10/1965 | Hook | 328/147 |
| 3,225,213 | 12/1965 | Hinrichs | 328/162 |
| 3,509,279 | 4/1970 | Martin | 375/76 |
| 4,034,340 | 7/1977 | Sant' Agostino | 375/10 |

Primary Examiner—Robert L. Griffin
Assistant Examiner—Stephen Chin
Attorney, Agent, or Firm—William R. Clark; Joseph D. Pannone

[57] ABSTRACT

An eye opening monitor for a binary waveform such as provided as the video output of a demodulator. At the decision sample time, the video is compared to $-V_{th}$ and $+V_{th}$ reference voltages to determine if it falls in the range defined therebetween. If it does, a counter is reset. Because the carry-out pulses of the counter are used to produce $-V_{th}$ and $+V_{th}$, the range defined therebetween is decreased by the additional time required to count to the carry-out after the counter is reset. The loop stabilizes with the range from $-V_{th}$ and $+V_{th}$ being quantitatively indicative of the eye opening. A voltage derived from $V_{th}$ is visually displayed.

2 Claims, 4 Drawing Figures

EYE OPENING MONITOR

CROSS-REFERENCE TO RELATED CASES

This is a continuation of application Ser. No. 162,339, filed June 23, 1980, now abandoned.

BACKGROUND OF THE INVENTION

In a typical binary modulation system, the expected receive signal levels may preferably be normalized to −1 volt or +1 volt at the sample time when the received signal decision is made. The decision may be made by taking a slicing level at 0 volts and then deciding whether the received signal is greater than or less than 0 volts at the sample time. This method allows a 1 volt tolerance to signal distortion before an error is made. For example, a −1 volt signal representing a logical 0 would have to deviate by 1 volt to cross the 0 volt threshold and be interpreted as a logical 1.

The received waveform makes transitions between the −1 volt and +1 volt levels in accordance with the data sequence that is sent. If a multiplicity of signal traces are superimposed on a display device such as an oscilloscope, an eye diagram is created. FIG. 1 shows an eye diagram for an ideal waveform while FIG. 2 shows a typical system waveform having inherent distortion commonly introduced by a modem or channel effects. From the eye diagram, or eye pattern as it has sometimes been referred to, experienced operators can derive valuable information relative to the performance of a system. For example, such modem hardware anomalies as filter misalignments, erroneous local oscillation offsets, nonlinearities and demodulator reference errors may be detected. Accordingly, many operational systems include a display device for this purpose. Furthermore, eye diagrams are frequently used in the initial alignment of modems to reduce later field maintenance and adjustment.

The region of the eye diagram where the data decision is made has commonly been referred to as the eye opening. This is the most critical region of the eye diagram as bit errors can be minimized by maximizing the eye opening. Ideally, for the normalized system described, the size of the eye opening is such that there are no traces between −1 volt and +1 volt; this assures a high confidence of data decisions. It is therefore important to provide a means for quantitatively monitoring the eye opening so as to improve performance by improving the bit error rate (BER).

SUMMARY OF THE INVENTION

The invention discloses a means for comparing a binary waveform signal to a reference voltage at the approximate decision sample time of the signal, means coupled to the output of the comparing means for generating the reference voltage comprising means for decreasing the reference voltage when the absolute magnitude of the reference voltage is greater than the absolute magnitude of the signal at the sample time, and means for providing a visual display in response to the refence voltage. Preferably, the binary waveform is the output of a demodulator. The invention may also be used in a QPSK modulation system wherein the comparing operation is performed on both the I and Q video outputs of the demodulator. It may be preferable that the generating means comprises a counter that is clocked to provide carry-out pulses at a predetermined count, the period between carry-out pulses being altered by resetting the counter with the output of the comparing means. Preferably the reference voltage is produced by the carry-out pulses. Also, the providing means may be a DC meter or a pen recorder The invention characterized as an eye-opening monitor for a demodulator may be practiced by means for comparing the binary waveform signal from the demodulator to a voltage range defined by $-V_{th}$ to $+V_{th}$ with the output of the comparing means being provided when the voltage of the signal is within the range at the sample time of the signal, means responsive to the output for generating $-V_{th}$ and $+V_{th}$ voltages the range of which is decreased when the output is received from the comparing means, and means for providing a visual display proportional to the range. The approximate decision sample time of the signal is defined as the time when the decision is made whether the waveform is in one binary state or the other. The clock for sampling the symbol is generally generated from the incoming data by conventional techniques.

The invention further discloses the method comprising the steps of generating a reference voltage, comparing it to a binary waveform signal from a demodulator at the decision sample time, decreasing the reference voltage when the absolute magnitude of the reference voltage is greater than the absolute magnitude of the signal at the sample time, and providing a visual display in response to the reference voltage.

BRIEF DESCRIPTION OF THE DRAWINGS

The invention itself, both as to its organization and method of operation, as well as additional objects and advantages thereof will become more readily apparent from a reading of the following detailed description in connection with the accompanying drawings wherein.

DESCRIPTION OF THE PREFERRED EMBODIMENT

Figure 1:
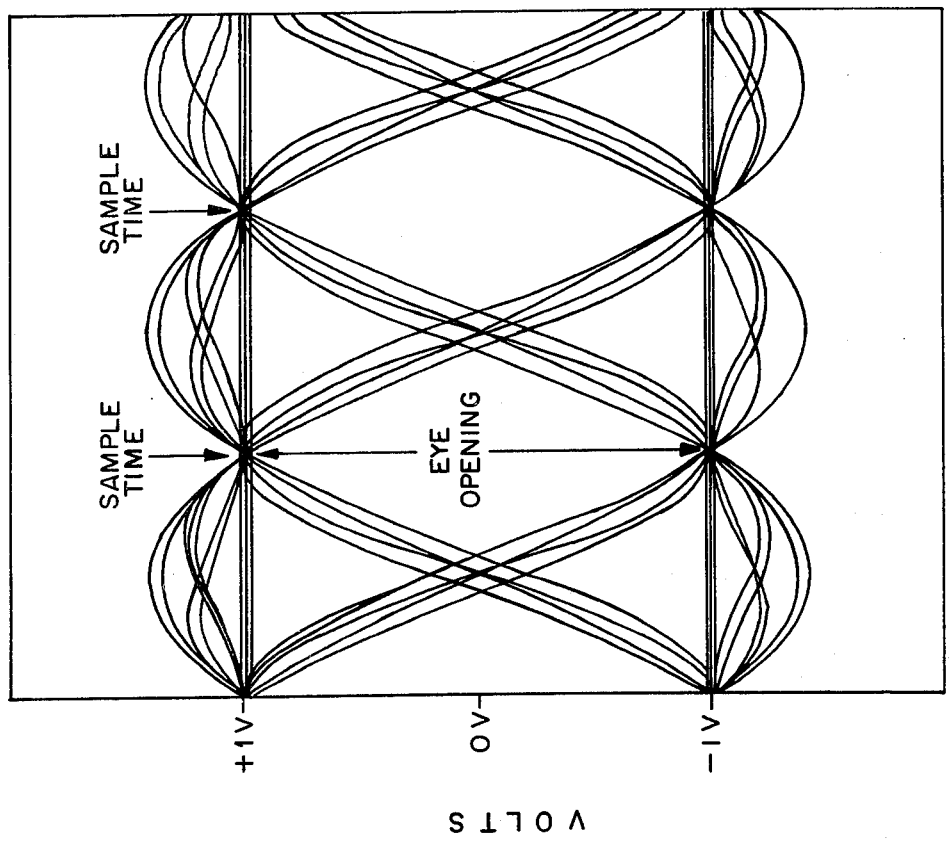
FIG. 1 is an ideal eye diagram of a binary waveform.

FIG. 1 shows an eye diagram for an ideal modem having maximum eye openings of normalized −1 to +1 volts. The data decision sampling at the eye opening with this optimum waveform minimizes the bit error rate and insures a high transmission confidence.

Figure 2:
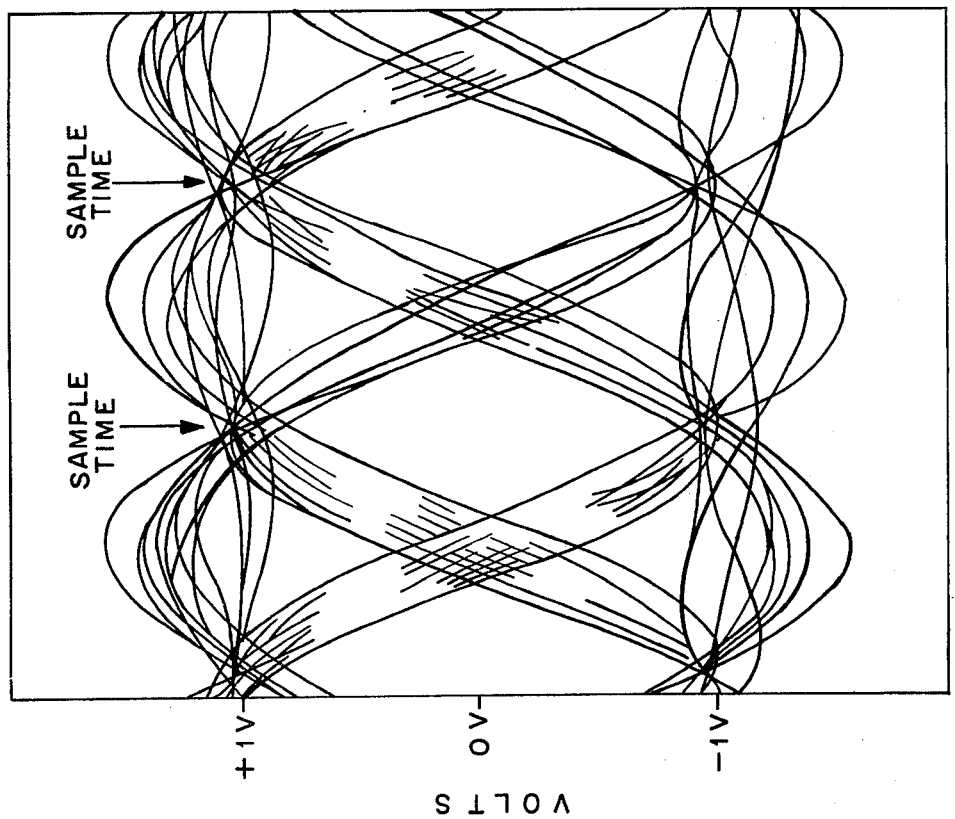
FIG. 2 is an exemplary eye diagram of a binary system waveform having inherent operational distortion.

FIG. 2 shows an eye diagram for a typical operational system having inherent distortion caused by modem anomalies and/or channel effects. It is noted that the separation between the two binary states is reduced thus raising the probability of a bit error at the data decision sample time. It is important to have a figure of merit relating to the eye opening. Short and long term degradation of the eye opening should be monitored as an indication of operational performance. Valuable information can be obtained from the eye opening relative to performance parameters such as, for example, alignment of the demodulator and status of the transmission medium.

Figure 3:
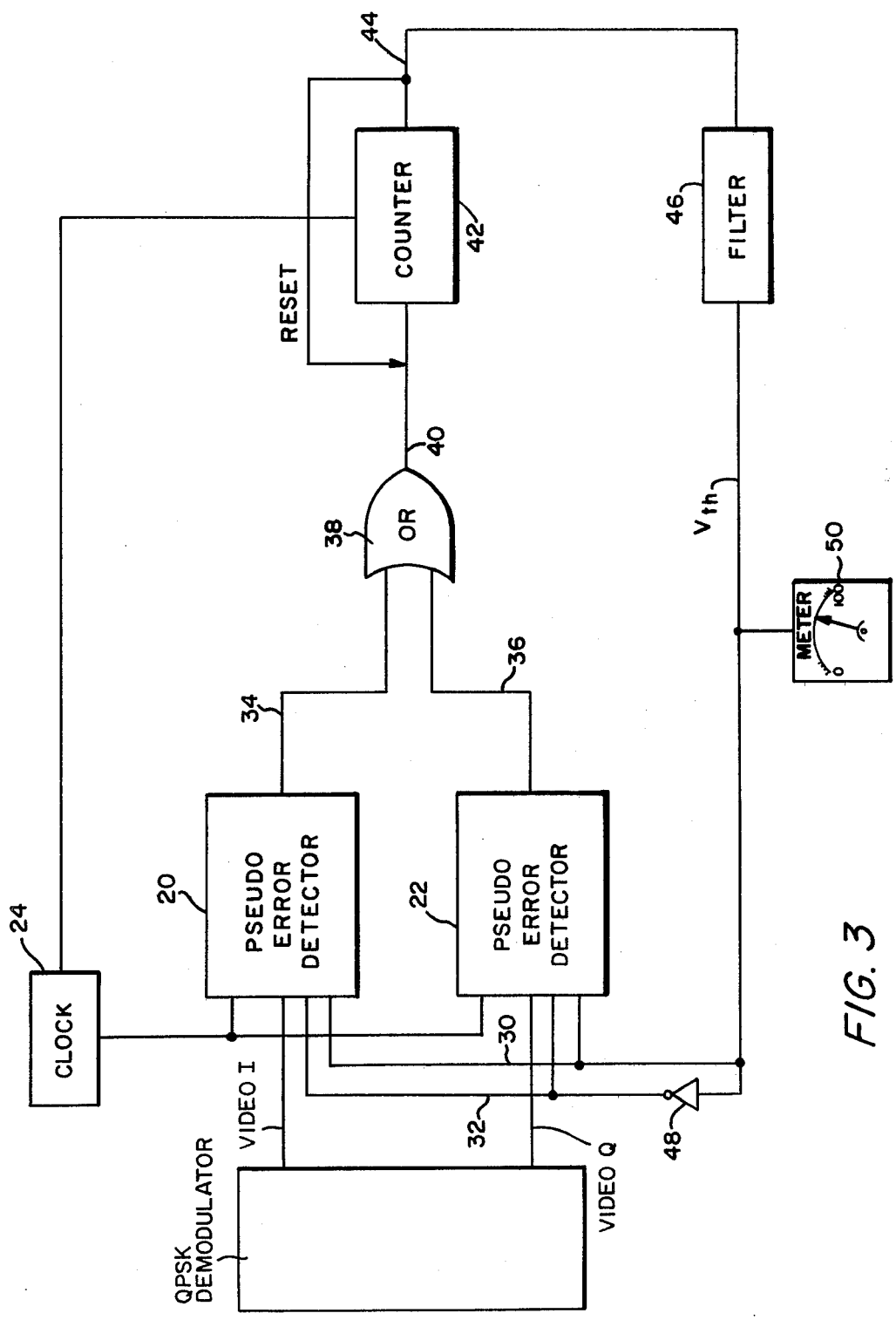
FIG. 3 is a block diagram of an eye opening monitor device.

FIG. 3 is a block diagram of an eye opening monitor embodying the invention. The basis concept of operation is to have a closed loop which adjusts a threshold voltage, $+V_{th}$, to approximately the inside of the eye opening at which point the loop is designed to be stable. Voltage $V_{th}$ is a quantitative measure of the eye opening and can be used as a figure of merit for monitoring system performance and for aligning hardware. The short term performance can be monitored by providing voltage $V_{th}$ to a meter; long term degradation can be monitored by providing voltage $V_{th}$ to a permanent recorder such as a pen chart.

Still referring to FIG. 3, the inputs to the eye opening monitor are video I and video Q each of which is a binary waveform such as would be the in-phase and quadrature-phase outputs from a conventional quadrature-phase shift keying (QPSK) demodulator. Although the invention is described with reference to QPSK, where two binary waveforms at the output of the demodulator designate a two bit symbol, it will be apparent that the invention has advantage for monitoring the eye opening of any binary waveform. Video I is coupled to pseudo error detector 20 and video Q is coupled to pseudo error detector 22. For a system having only one binary waveform, only one pseudo error detector would be used. Clock 24 is also provided to pseudo error detectors 20 and 22, respectively. Clock 24 is the symbol clock used for data decision sampling within the modem and is typically generated from the incoming data signal by conventional techniques. Pseudo error detectors 20 and 22 have two other inputs coupled on lines 30 and 32 as shown. Voltage $V_{th}$ is on line 30 and voltage $-V_{th}$ is on line 32. The derivation of voltage $V_{th}$ in the closed loop of the eye opening monitor will be described later herein. However, for the present, assume that voltage $V_{th}$ and voltage $-V_{th}$ define the approximate inside of the eye opening. At the exact time that the data decision sample is taken within the modem, pseudo error detectors 20 and 22 function to determine whether the instantaneous voltage of either video I or video Q is in the voltage range between voltage $V_{th}$ and $-V_{th}$. For example, if voltage $V_{th}$ were +1 volt and voltage $-V_{th}$ were −1 volt and video I were 0.85 volts at the data decision sample time, a high voltage or logical 1 would be provided at the output of pseudo error detector 20 on line 34. Pseudo error detector 22 functions in a similar manner for the video Q input. Accordingly, if either video I or video Q is in the range from voltage $-V_{th}$ to voltage $+V_{th}$ at the data decision sample time, a high voltage will appear at the output of OR gate 38 on line 40.

Counter 42 counts to a predetermined count such as, for example, 256 and then provides a carry-out pulse on line 44. As depicted in FIG. 3, the carry-out pulse on line 44 also provides a reset to counter 42 to commence the upward count to 256 once again. Accordingly, if the output of OR gate 38 on line 40 does not provide a reset to counter 42, the counter will provide a carry-out pulse on line 44 every 256 clock pulses of clock 24. This is the maximum number of carry-out pulses (one every 256 clock pulses) that can be provided by counter 42 on line 44. Accordingly, voltage $V_{th}$ at the output of filter 46 charged by line 44 reaches its maximum value when there are no counter reset pulses provided on line 40 at the output of OR gate 38. As voltage $V_{th}$ and correspondingly voltage $-V_{th}$ at the output of inverter 48 increase to their maximum respective magnitudes, the probability of video I and video Q falling in the range defined therebetween is increased. At some point, for the particular eye opening being monitored, pseudo errors maay begin to be detected by pseudo error detectors 20 and 22. A pseudo error is defined as the video falling in the range between voltage $-V_{th}$ and $+V_{th}$ at the decision sample time; it may be but is not necessarily a bit or symbol error. A pseudo error from either of these two detectors results in a high voltage on line 34 or 36 respectively and a high voltage on line 40 at the output of OR gate 38. This causes counter 42 to be reset to a zero count before the normal 256 count is reached. Accordingly, the carry-out pulse on line 44 is delayed. It follows that the charge to filter 46 and the corresponding voltage $V_{th}$ will be reduced. In theory, if pseudo errors were frequently detected such that counter 42 was never able to count to 256 to output carry-out pulses on line 44, voltage $V_{th}$ would decrease to 0 volts at which time no more errors could be detected in the range from $-V_{th}$ to $V_{th}$ and $V_{th}$ would increase. The loop so described stabilizes on a voltage $V_{th}$ which is quantitatively indicative of the eye opening. Voltage $V_{th}$ is monitored by conventional DC meter 50. If the long term value of $V_{th}$ is desired, a permanent recorder may be used in addition or in place of meter 50.

Figure 4:
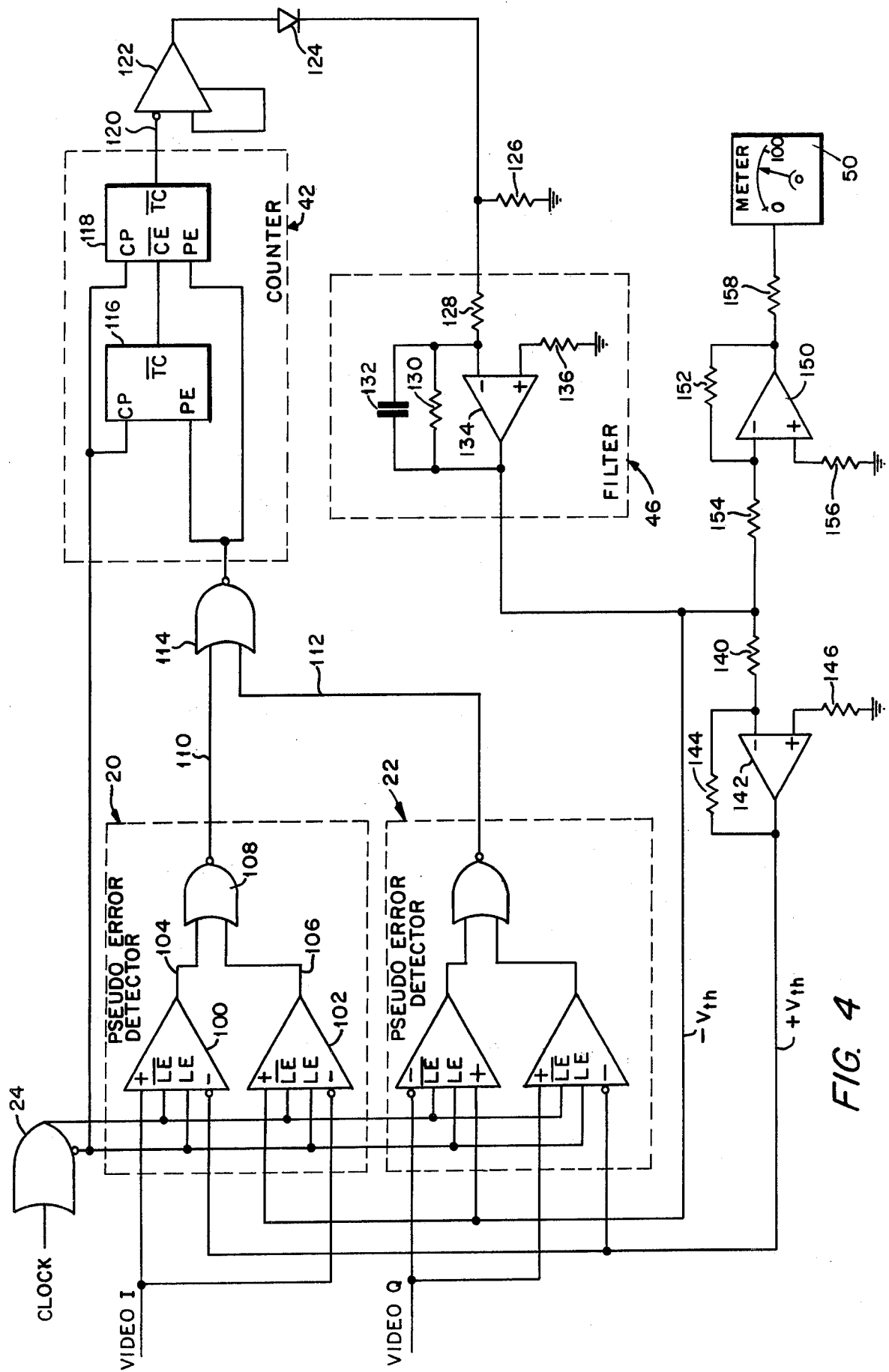
FIG. 4 is a schematic of a circuit implementation of the block digram of FIG. 3.

FIG. 4 is a schematic of a circuit implementation of the block diagram of FIG. 3. Pseudo error detectors 20 and 22 are similar in design except that detector 20 processes video I and detector 22 processes video Q. Accordingly, only pseudo error detector 20 will be described. Pseudo error detector 20 comprises two comparators 100 and 102. Although other comparators could be used, the description herein is with reference to an Advanced Micro Devices AM687. The LE and $\overline{LE}$ inputs are respectively connected to the data decision sample clock and its complement. The positive input of comparator 100 and the negative input of comparator 102 are connected to video I which, as described earlier herein, is the in-phase video output of a conventional QPSK demodulator. The negative input of comparator 100 is connected to $V_{th}$, to be described in detail later herein. The positive input of comparator 102 is connected to voltage $-V_{th}$. Accordingly, when the clock and its complement change states which is indicative of the data decision sample time, the output of comparator 100 on line 104 is a low voltage (logical 0) if and only if voltage $V_{th}$ is greater than video I. Similarly, the output of comparator 102 on line 106 is a low voltage if and only if video I is greater than voltage $-V_{th}$. Lines 104 and 106 are NORed in NOR GATE 108 and the output is provided on line 110 which is analogous to line 34 of FIG. 3. Accordingly, a high voltage (logical 1) on line 110 will be provided only if video I is between voltage $-V_{th}$ and voltage $+V_{th}$ at the data decision sample time. Line 112 from pseudo detector 22 is analogous to line 36 of FIG. 3.

A high voltage on either line 110 or line 112 from pseudo error detectors 20 and 22 respectively, causes the output of NOR GATE 114 to be a low voltage. This low voltage is the reset state for counter 42.

Counter 42 comprises two 16-count counters, such as, for example, Motorola MC10116, configured so as to provide a 256-count counter. Both 16-count counters 116 and 118 have CP inputs connected to the complement of the data decision sample clock. Without any reset pulses from NOR GATE 114, counter 116 counts to 16 and then provides counter 118 with a $\overline{CE}$ enable for 1 count. Accordingly, after 256 pulses, one carry-out pulse is provided from counter 118 on line 120. Any time a pseudo error is detected in either pseudo error detector 20 or pseudo error detector 22, both counters 116 and 118 are reset at their PE inputs and the counting process is reinitiated from zero.

The output of counter 42 on line 120 is connected to amplifier 122 which functions to convert the ECL logic levels to TTL. Diode 124 prevents discharge of filter 46 back towards amplifier 122. Resistor 126 provides discharge to ground, preferably through high resistance such as 10K ohms.

Still referring to FIG. 4, when the carry-out of counter 42 goes high for 1 clock pulse, capacitor 132, which is connected in parallel with resistor 130 across linear amplifier 134, is charged. In the preferred embodiment, capacitor 132 is 1 micro farad, resistor 130 is 15K ohms, and linear amplifier 134 is a National LM747. Furthermore, resistor 128 is 750 ohms and the positive input of amplifier 134 is connected through resistor 136 which is 680 ohms to ground. Accordingly, filter 46 provides RC filtering and gain of 20. Filter 46 has a time constant of 15 milliseconds which is long with respect to 256 counts or clock pulses at a typical data rate of, for example, 45 MHz.

The output of filter 46 is designated $-V_{th}$ and is coupled to inputs of pseudo error detectors as described earlier herein. Also, voltage $-V_{th}$ is connected through resistor 140 to the negative input of linear amplifier 142. Resistor 140 and resistor 144 which is connected across amplifier 142 have the same resistance which is preferably 1K ohms. The positive input terminal of amplifier 142 is connected through resistor 146, preferably 510 ohms, to ground. Amplifier 142 as configured functions as an inverter to generate voltage $+V_{th}$ which, like voltage $-V_{th}$, is connected to inputs of the pseudo error detectors as shown.

In the loop of the described circuit of FIG. 4, the magnitudes of $+V_{th}$ and $-V_{th}$ stabilize to the inside of the eye opening. If the magnitudes of $V_{th}$ and $-V_{th}$ tended to increase with respect to the eye opening, the number of pseudo errors detected would increase which would result in more resets of counter 42 and fewer carry-out pulses to charge capacitor 132. Accordingly, the magnitudes of $V_{th}$ and $-V_{th}$ would decrease. If the magnitudes of $+V_{th}$ and $-V_{th}$ tended to decrease with respect to the eye opening, fewer pseudo errors would be detected which would result in fewer resets of counter 42 and more carry-out pulses. Accordingly, the magnitudes of $V_{th}$ and $-V_{th}$ would increase.

Voltage $V_{th}$ (or $-V_{th}$), which is quantitative value indicative of the eye opening or a voltage derived from it, may be displayed on a DC meter. In the preferred embodiment, gain and inversion of $-V_{th}$ are provided by linear amplifier 150. Resistor 152 which is connected across amplifier 115 is 5.1K ohms. Resistor 154 through which the negative input is coupled to amplifier 150 is 1K ohms. Resistor 156, through which the positive input of amplifier 150 is connected to ground, is 820 ohms. Also, resistor 158, connected between amplifier 150 and meter 50 is 9.1K ohms.

It may be preferable to provide a permanent record indicative of $V_{th}$ to monitor long term degradation of the eye opening. For this purpose, a permanent display such as a pen recorder would be connected in lieu of or in addition to meter 50.

This concludes the description of the preferred embodiment. However, many modifications and alterations will become apparent to those skilled in the art without departing from the spirit and scope of the invention as described herein. Therefore, it is intended that the scope of the invention be limited only by the appended claims.

What is claimed is:

1. An eye opening monitor circuit for a QPSK demodulator, comprising:
    means for comparing the in-phase signal from said demodulator to a voltage range defined by $-V_{th}$ to $+V_{th}$, the output of said in-phase comparing means being a first input to an OR gate;
    means for comparing the quadrature-phase signal from said demodulator to said voltage range defined by $-V_{th}$ to $+V_{th}$, the output of said quadrature-phase comparing means being the second input to said OR gate;
    means responsive to the output of said OR gate for generating said $-V_{th}$ and $+V_{th}$ voltages, the range of which is decreased when either said in-phase or quadrature-phase signal is within said range defined by $-V_{th}$ and $+V_{th}$ voltages;
    said generating means comprising a clocked counter providing a carry-out pulse at a predetermined count, the period between carry-out pulses being altered by resetting said counter with said output of said OR gate; and
    means for providing a visual display proportional to said range.

2. The combination in accordance with claim 1 wherein said $-V_{th}$ and $+V_{th}$ voltages are produced in response to said carry-out pulses.

* * * * *